(12) United States Patent
Saijo et al.

(10) Patent No.: US 6,841,877 B2
(45) Date of Patent: Jan. 11, 2005

(54) SEMICONDUCTOR DEVICE, METAL LAMINATED PLATE FOR FABRICATING CIRCUIT ON SEMICONDUCTOR, AND METHOD OF FABRICATING CIRCUIT

(75) Inventors: Kinji Saijo, Yamaguchi-ken (JP); Kazuo Yoshida, Yamaguchi-ken (JP); Hiroaki Okamoto, Yamaguchi-ken (JP); Shinji Ohsawa, Yamaguchi-ken (JP)

(73) Assignee: Toyo Kohan Co., Ltd., Tokyo (JP)

( * ) Notice: Subject to any disclaimer, the term of this patent is extended or adjusted under 35 U.S.C. 154(b) by 0 days.

(21) Appl. No.: 10/169,917

(22) PCT Filed: Dec. 26, 2000

(86) PCT No.: PCT/JP00/09255

§ 371 (c)(1),
(2), (4) Date: Nov. 12, 2002

(87) PCT Pub. No.: WO01/52322

PCT Pub. Date: Jul. 19, 2001

(65) Prior Publication Data

US 2003/0134497 A1 Jul. 17, 2003

(30) Foreign Application Priority Data

Jan. 12, 2000 (JP) .................................... 2000-004041

(51) Int. Cl.[7] .......................... H01L 23/48; H01L 21/44
(52) U.S. Cl. ..................... 257/750; 257/762; 438/614; 438/642; 438/652; 438/687
(58) Field of Search ................................ 438/612, 614, 438/642, 652, 669, 687, 688; 257/750, 762, 765, 766

(56) References Cited

U.S. PATENT DOCUMENTS 5,200,026 A  4/1993  Okabe 5,677,576 A  10/1997  Akagawa
5,834,844 A  11/1998  Akagawa et al.

FOREIGN PATENT DOCUMENTS

| JP | 8005664 A | 1/1996 |
| JP | 11067823 | 3/1999 |
| WO | WO 99/58470 | 11/1999 |

OTHER PUBLICATIONS

Saijo, Kinji et al. "Method of Manufacturing Metal Foil/Ceramics Joining Material and Metal Foil Laminated Ceramic Substrate," Nov. 18, 1999.
Kawakzoe, Hiroshi et al. "Inspection Board for Semiconductor Device and Its Production," Jan. 12, 1996.
Yamazaki, Akio et al. "Manufacture of Wiring Board with Bump and Semiconductor Package," Mar. 9, 1999.

*Primary Examiner*—Kevin M. Picardat
(74) *Attorney, Agent, or Firm*—Browdy and Neimark, P.L.L.C.

(57) ABSTRACT

A means for highly precisely and economically fabricating wiring on a semiconductor and highly precisely and economically forming a bump on an electrodes. (1) A semiconductor device comprising a semiconductor, a metal foil for fabricating wiring and conductor wiring on the semiconductor, and a method of fabricating a conductor wiring circuit on a semiconductor, comprising the steps of laying a metal foil for fabricating wiring on the electrode-forming side of the semiconductor, forming a resist wiring pattern by photo-etching the metal foil, etching the metal foil, and removing the resist to form the wiring. (2) A semiconductor device which comprises a multilayer metal foil for fabricating wiring in place of the metal foil for forming wiring of the semiconductor device described in (1); and a method of fabricating conductor wiring having a bump on a semiconductor, comprising the steps of the method described in (1) and further comprising the steps of forming a resist pattern for forming the bump by photo-etching the multilayer metal foil for forming the wiring, forming a bump by selective etching, and removing an etch-stop layer.

24 Claims, 3 Drawing Sheets

SEMICONDUCTOR DEVICE, METAL LAMINATED PLATE FOR FABRICATING CIRCUIT ON SEMICONDUCTOR, AND METHOD OF FABRICATING CIRCUIT

FIELD OF THE INVENTION

The present invention provides a semiconductor device formed with a conductor wiring, a method for fabricating the conductor wiring, a semiconductor device formed with a conductor wiring having a bump, and a method for fabricating the conductor wiring having the bump.

BACKGROUND ART

Recently the techniques for downsizing IC chips, achieving higher performances, and increasing packaging density and the number of pins progress remarkably. On the other hand, an electrode pitch of a chip has become narrower and narrower because of the downsized chip and the increased pins.

If an electrode array has a decreased pitch, high precision is required in the mounting of a chip on an interposer or printed wiring board. This results in undesirable increased costs for facilities. Hence, the electrodes arranged around the chip at a small pitch need be re-arranged on the chip to increase the electrode pitch, so as to facilitate the subsequent mounting process.

In order to re-arrange the electrodes, conductor wirings need be formed on a chip surface on which the electrodes are formed. It has been a conventional practice to form the wirings by a vapor deposition process, which results in cost increase. On the other hand, it is necessary to form bumps on the re-arranged electrodes. The formation of the bumps entails high cost.

The invention is directed to a solution to the above problem of the prior art and has an object to provide means to permit the wirings to be formed on the semiconductor in an economical and highly precise manner as well as to permit the bumps to be formed on the electrodes in a highly precise and inexpensive manner.

DISCLOSURE OF THE INVENTION

The inventors overlaid a metal foil for wiring formation on an electrode fabricating surface of a semiconductor chip or wafer formed with circuits by using a technique of bonding the metal foil with a ceramic, the application of which technique was previously filed (see International Unexamined Patent Publication No. WO99/58470). Subsequently, the metal foil was etched to form the wirings. Thus, the inventors have found a solution to the problem regarding the formation of wirings on the semiconductor, thus achieving one of the above objects.

As to the bump formation, the inventors have found that a multilayer metal foil for wiring formation may be overlaid on the electrode fabricating surface of the semiconductor chip or the like, so as to permit an etching process alone to form the wiring having the bump thereon.

That is, the invention set forth in claim 1 provides a semiconductor device comprising a semiconductor, a metal foil for wiring formation and a conductor wiring on the semiconductor (hereinafter, referred to as a first embodiment of the invention).

In this case, it is preferred that the metal foil for wiring formation comprises copper, aluminum, nickel or an alloy selected from two or more of these metals.

In this case, it is further preferred that the metal foil for wiring formation is a metal foil having a thickness of 1 to 50 μm.

As set forth in claim 4 of the invention, such a semiconductor device according to the first embodiment of the invention may be fabricated by a method for fabricating a conductor wiring on a semiconductor comprising the steps of: overlaying a metal foil for wiring formation on an electrode fabricating surface of a semiconductor; fabricating a resist wiring pattern on the metal foil; etching the metal foil; and removing the resist to obtain a wiring.

In this case, it is preferred that the metal foil for wiring formation comprises copper, aluminum, nickel or an alloy selected from two or more of these metals.

In this case, it is further preferred that the metal foil for wiring formation is a metal foil having a thickness of 1 to 50 μm.

In this case, it is preferred that the semiconductor has a metallic thin film overlaid on a surface thereof. It is further preferred that the metallic thin film is formed of nickel.

The invention set forth in claim 9 provides a semiconductor device comprising a semiconductor, a multilayer metal foil for wiring formation, a bump on the semiconductor and a conductor wiring (hereinafter, referred to as a second embodiment of the invention).

In this case, it is preferred that the multilayer metal foil for wiring formation is a metal laminate comprising copper, aluminum, nickel or an alloy selected from two or more of these metals.

Further, it is preferred that the multilayer metal foil for wiring formation is a metal laminate comprising a copper or solder foil for bump formation, an etch-stop layer of nickel, and a wiring copper foil.

It is further preferred that the etch-stop layer of nickel is laminated by plating. In this case, it is further preferred that the bump-fabricating copper or solder foil of the multilayer metal foil for wiring formation has a thickness of 5 to 100 μm, the etch-stop layer of plated nickel having a thickness of 0.5 to 3 μm, the wiring copper foil having a thickness of 1 to 100 μm.

In this case, it is preferred that the etch-stop layer of nickel is formed by cladding a foil. It is further preferred that the bump-fabricating copper or solder foil of the multilayer metal foil for wiring formation has a thickness of 5 to 100 μm, the etch-stop layer of nickel clad having a thickness of 1 to 10 μm, the wiring copper foil having a thickness of 1 to 100 μm.

Furthermore, it is preferred in this case that the multilayer metal foil for wiring formation is a metal laminate comprising a copper or solder foil for bump formation, and an aluminum or silver foil for wiring formation. In this case, it is preferred that the bump-fabricating copper or solder foil of the multilayer metal foil for wiring formation has a thickness of 5 to 100 μm, the wiring-fabricating aluminum or silver foil having a thickness of 1 to 100 μm.

Such a semiconductor device according to the second embodiment of the invention may be fabricated by a method for fabricating a conductor wiring having a bump on a semiconductor, the method comprising the steps of: overlaying a multilayer metal foil for wiring formation on an electrode fabricating surface of a semiconductor; photoetching the multilayer metal foil for fabricating a resist wiring pattern for bump formation; fabricating a bump by selective etching; removing an etch-stop layer; fabricating a resist wiring pattern for wiring formation; fabricating a wiring by etching; and removing the resist to obtain the wiring.

In this case, it is preferred that the multilayer metal foil for wiring formation is a metal laminate comprising copper, aluminum, nickel or an alloy selected from two or more of these metals.

In this case, it is preferred that the multilayer metal foil for wiring formation is a metal laminate comprising a copper or solder foil for bump formation, an etch-stop layer of nickel, and a wiring copper foil.

In this case, it is preferred that the etch-stop layer of nickel is laminated by plating. It is further preferred that the bump-fabricating copper or solder foil of the multilayer metal foil for wiring formation has a thickness of 5 to 100 $\mu$m, the etch-stop layer of plated nickel having a thickness of 0.5 to 3 $\mu$m, the wiring copper foil having a thickness of 1 to 100 $\mu$m.

In this case, it is preferred that the etch-stop layer of nickel is formed by cladding a foil. It is further preferred that the bump-fabricating copper or solder foil of the multilayer metal foil for wiring formation has a thickness of 5 to 100 $\mu$m, the etch-stop layer of nickel clad having a thickness of 1 to 10 $\mu$m, the wiring copper foil having a thickness of 1 to 100 $\mu$m.

Furthermore, it is preferred in this case that the multilayer metal foil for wiring formation is a metal laminate comprising a copper or solder foil for bump formation, and an aluminum or silver foil for wiring formation. It is further preferred that the bump-fabricating copper or solder foil of the multilayer metal foil for wiring formation has a thickness of 5 to 100 $\mu$m, the wiring-fabricating aluminum or silver foil having a thickness of 1 to 100 $\mu$m.

In this case, it is preferred that the semiconductor has a metallic thin film overlaid on a surface thereof. It is further preferred that the metallic thin film is formed of nickel.

BEST MODES FOR CARRYING OUT THE INVENTION

First, the first embodiment of the invention will be described.

The first embodiment of the invention relates to a semiconductor device including a semiconductor, a metal foil for wiring formation, and a conductor wiring on the semiconductor.

A material for the metal foil for wiring formation is not particularly limited and may include those metals normally used in the art. However, preferable metals include copper, aluminum, nickel and alloys selected from two or more of these metals.

The metal foil for wiring formation may have a thickness of 1 to 50 $\mu$m or preferably of 5 to 20 $\mu$m.

Examples of a usable semiconductor include chips, wafers and the like which are normally used in the art. The conductor wiring may be formed in any form as desired.

Such a semiconductor device according to the first embodiment of the invention can be fabricated by a method for fabricating a conductor wiring on a semiconductor comprising the steps of: overlaying a metal foil for wiring formation on an electrode fabricating surface of a semiconductor; fabricating a resist wiring pattern on the metal foil; etching the metal foil; and removing the resist to obtain a wiring.

Examples of a usable substrate include those normally used in the art, such as semiconductor wafers, chips and the like. The metal foil for wiring formation may preferably employ a copper foil having a thickness of 1 to 50 $\mu$m (FIG. 1).

In some cases, the semiconductor wafer may be subjected to surface cleaning followed by sputtering, vapor deposition or the like, thereby to overlay a metallic thin film on a surface thereof. This facilitates the overlaying of the metal foil on the semiconductor. As to a metal for fabricating the thin film, there may be used Cr, Mo, W or the like as a barrier metal in a case where a semiconductor chip electrode is formed of aluminum. However, such a metal is hard to be removed by etching in the subsequent step. Hence, nickel may be preferably used in the light of easy removal by etching. In a case where a chip electrode is Cu, Cu may preferably be used as the metallic thin film.

Figure 1:
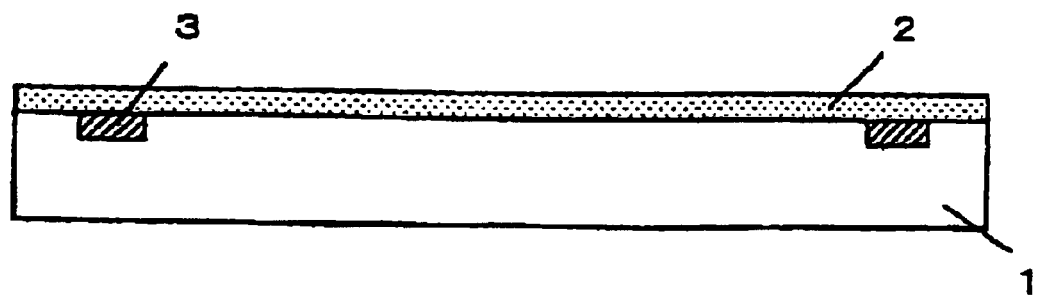
FIG. 1 is a sectional diagram showing a step of a circuit fabricating procedure according to the first embodiment of the invention (overlaying a copper foil for wiring formation on a semiconductor wafer)

The technique set forth in International Unexamined Patent Publication No. WO99/58470, the application of which technique was previously filed by the inventors, may be used to laminate the metal foil for wiring formation to the semiconductor (FIG. 1).

Figure 2:
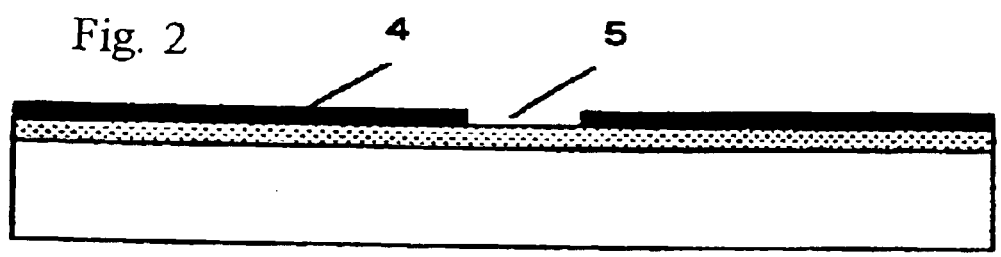
FIG. 2 is a sectional diagram showing a step of the circuit fabricating procedure according to the first embodiment hereof (fabricating a resist wiring pattern)

After lamination, a resist coat is applied onto the metal foil for wiring formation and then light exposure and development processes are performed to form a resist wiring pattern. The sequence of processes may be performed based on the known methods (FIG. 2).

Subsequently, the metal foil for wiring formation is etched. Where the metal foil is copper, a commercially available alkaline copper etching solution may be used for etching the copper.

Lastly, the resist is removed to obtain a wiring (FIG. 3) It is noted here that in a case where the metallic thin film is formed, the thin film is removed by etching.

Next, the second embodiment of the invention will be described.

The second embodiment of the invention provides a semiconductor device including a semiconductor, a multilayer metal foil for wiring formation, a bump on the semiconductor and a conductor wiring.

It is desirable here that the multilayer metal foil for wiring formation employs a metal laminate comprising copper, solder, aluminum, nickel or an alloy selected from two or more of these metals.

Above all, the multilayer metal foil for wiring formation may preferably comprise a copper or solder foil for bump formation, an etch-stop layer of nickel and a wiring copper foil.

The etch-stop layer of nickel may be laminated by plating or formed by cladding a foil.

In a case where the etch-stop layer is laminated by plating, the respective layers of the multilayer metal foil for wiring formation may have thickness as follows. The thickness of the copper or solder foil for bump formation is in the range of 5 to 100 μm or preferably of 10 to 50 μm; that of the etch-stop layer of plated nickel is in the range of 0.5 to 3 μm or preferably of 1 to 2 μm; and that of the wiring copper foil is in the range of 1 to 100 μm or preferably of 5 to 20 μm.

In a case where the etch-stop layer of nickel is formed by cladding a foil, on the other hand, the respective layers of the multilayer metal foil for wiring formation may have thickness as follows. The thickness of the copper or solder foil for bump formation is in the range of 5 to 100 μm or preferably of 10 to 50 μm; that of the etch-stopper layer of nickel clad is in the range of 1 to 10 μm or preferably of 1.5 to 5 μm; and that of the wiring copper foil is in the range of 1 to 100 μm or preferably of 5 to 20 μm.

Besides the above multilayer metal foils, the multilayer metal foil for wiring formation may further employ a metal laminate comprising a copper or solder foil for bump formation, and an aluminum or silver foil for wiring formation.

In this case, it is preferred that the copper or solder foil for bump formation has a thickness of 5 to 100 μm or preferably of 10 to 50 μm, and the aluminum or silver foil for wiring formation has a thickness of 1 to 100 μm or preferably of 5 to 20 μm.

Such a semiconductor device may be fabricated by a method for fabricating a conductor wiring having a bump on a semiconductor, the method comprising the steps of: overlaying a multilayer metal foil for wiring formation on an electrode fabricating surface of a semiconductor; fabricating a resist wiring pattern for bump formation on the multilayer metal foil; fabricating a bump by selective etching; removing an etch-stop layer; fabricating a resist wiring pattern for wiring formation; fabricating a wiring by etching; and removing the resist to obtain the wiring.

Figure 4:
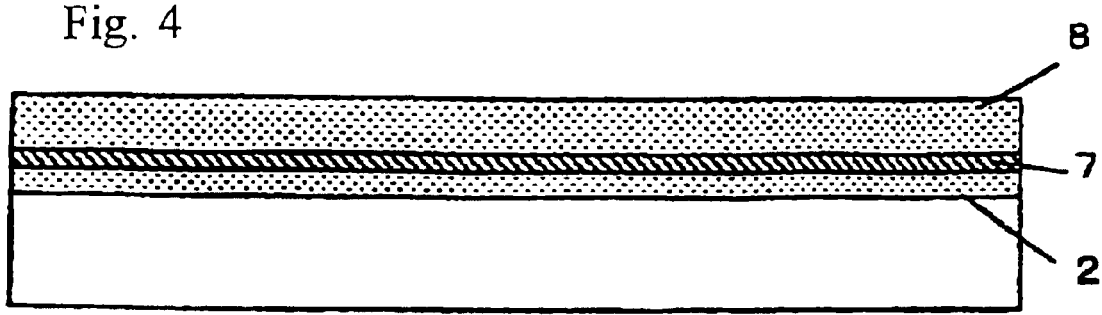
FIG. 4 is a sectional diagram showing a step of a circuit fabricating procedure according to the second embodiment of the invention (overlaying a metal laminate for wiring formation on a semiconductor wafer)

Specifically, a metal foil for wiring formation is overlaid on a semiconductor wafer or the like (FIG. 4).

As described above, the multilayer metal foil for wiring formation may employ a metal laminate comprising the copper or solder foil for bump formation, the etch-stop layer of nickel, and the wiring copper foil; or a metal laminate comprising the copper or solder foil for bump formation, and the aluminum or silver foil for wiring formation.

The multilayer metal foil may be laminated the same as in the aforementioned first embodiment. Similarly to the first embodiment, a metallic thin film may be provided prior to the lamination of the metal foil.

Figure 5:
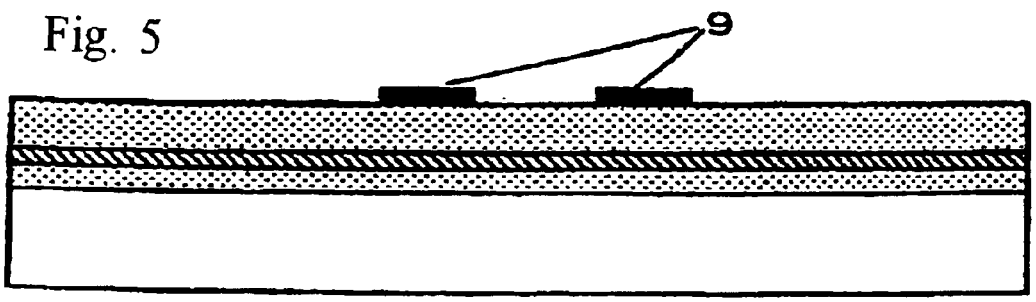
FIG. 5 is a sectional diagram showing a step of the circuit fabricating procedure according to the second embodiment hereof (fabricating a resist wiring pattern for bump formation)

A resist coat is applied onto the multilayer metal foil for wiring formation and then the light exposure and development processes are performed to form a resist wiring pattern for bump formation (FIG. 5). These processes may be performed based on the known methods.

Subsequently, a bump fabricating layer is selectively etched (FIG. 6), thereby to form a bump. In a case where the bump fabricating layer is a copper foil, there may be used a commercially available copper etching solution such as including sulfuric acid and peroxide.

Figure 7:
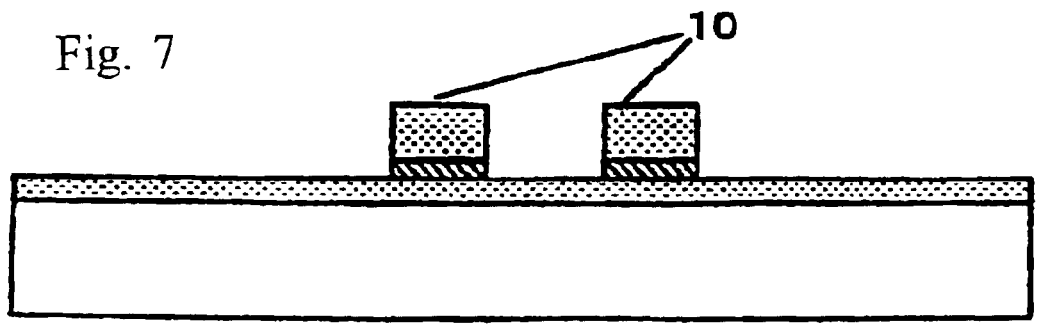
FIG. 7 is a sectional diagram showing a step of the circuit fabricating procedure according to the second embodiment hereof (selectively etching an etch-stop layer of nickel and fabricating a bump)

Next, an etch-stop layer is removed. In a case where the etch-stop layer is formed of nickel, there may be used a commercially available nickel remover (for example, N-950 available from Meltex Inc.) (FIG. 7).

Figure 8:
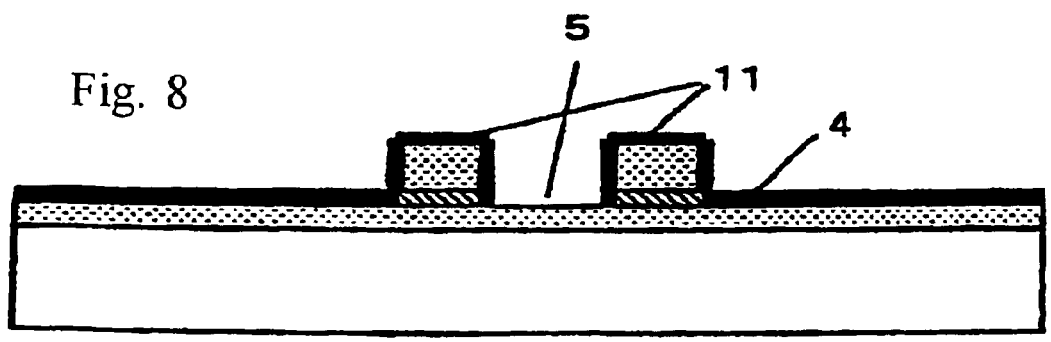
FIG. 8 is a sectional diagram showing a step of the circuit fabricating procedure according to the second embodiment hereof (fabricating a resist wiring pattern for wiring formation)

Subsequently, a resist wiring pattern for wiring formation is formed in a desired form (FIG. 8).

Figure 9:
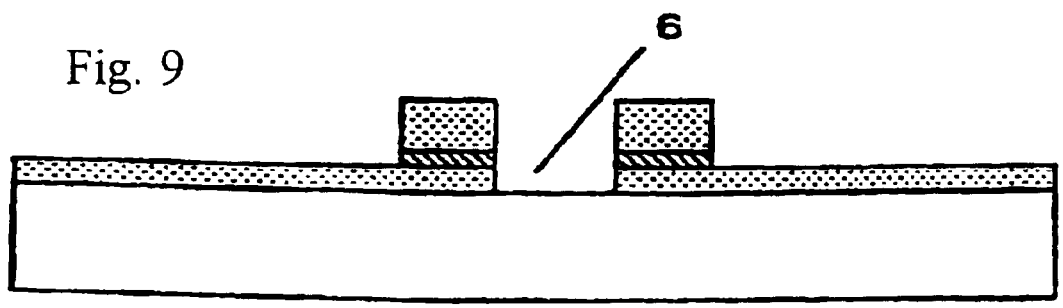
FIG. 9 is a sectional diagram showing a step of the circuit fabricating procedure according to the second embodiment hereof (selectively etching a copper foil and fabricating a wiring).

Lastly, a wiring is formed by etching with a commercially available alkaline copper etching solution. Thereafter, the resist is removed (FIG. 9).

EXAMPLES

The invention will be described in more details by way of reference to examples thereof.

Example 1

(Fabricating Wiring on Semiconductor)
1. Materials

A semiconductor wafer 1 was used as a substrate whereas a copper foil (thickness of 15 μm) 2 was used as the metal foil for wiring formation (FIG. 1). It is noted that an aluminum electrode 3 is embedded in the semiconductor wafer 1.

2. Fabricating Thin Film on Semiconductor Wafer

After surface cleaning, the semiconductor wafer was subjected to sputtering, vapor deposition or the like to form a nickel (copper) thin film over the surface thereof (not shown).

3. Lamination

The copper foil for wiring formation 2 was laminated onto the semiconductor wafer 1 using the technique set forth in International Unexamined Patent Publication No. WO99/58470, the application of which the technique was previously filed by the inventors (FIG. 1).

4. Fabricating Resist Wiring Pattern

A resist coat 4 was applied onto the copper foil and then the light exposure and development processes were performed to form a resist wiring pattern 5 (FIG. 2).

5. Etching

Figure 3:
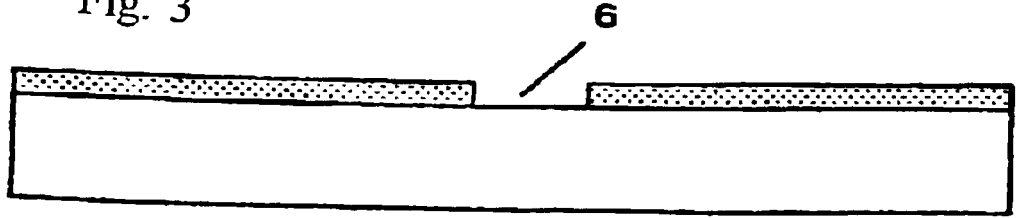
FIG. 3 is a sectional diagram showing a step of the circuit fabricating procedure according to the first embodiment hereof (selectively etching a copper foil for fabricating a wiring)

The copper was etched using a commercially available alkaline copper etching solution (FIG. 3).

6. The Resist 4 was Removed Thereby to Form a Wiring 6 (FIG. 3)

Lastly, a nickel thin film was removed by etching.

Example 2

(Fabricating Bump on Semiconductor)
1. Materials

The substrate employed the same semiconductor wafer 1 as that used in Example 1. On the other hand, the metal foil for wiring formation employed a metal laminate including a copper or solder foil for bump formation (thickness of 35 μm) 8, an etch-stop layer of plated nickel (thickness of 1 μm) 7, and a wiring copper foil (15 μm) (FIG. 4).

2. Lamination

The metal laminate (the multilayer metal foil represented by the reference numerals 8, 7 and 2) was overlaid on the semiconductor wafer 1 the same way as in Example 1 (FIG. 4).

3. Fabricating Resist Wiring Pattern for Bump Formation

The resist coat 4 was applied onto the metal laminate and then the light exposure and development processes were performed to form a resist wiring pattern for bump formation 9 (FIG. 5).

4. Etching

Figure 6:
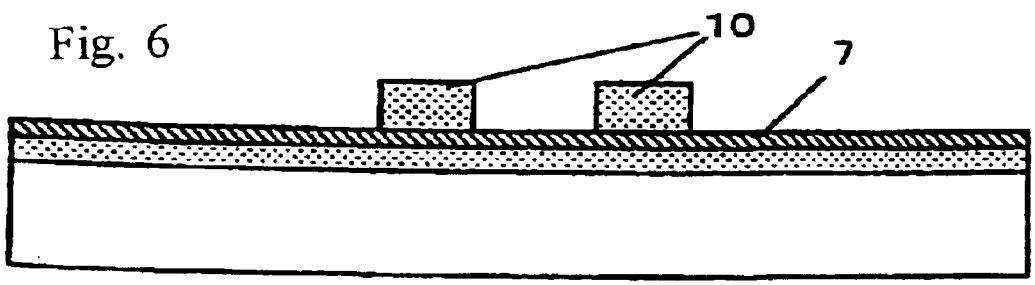
FIG. 6 is a sectional diagram showing a step of the circuit fabricating procedure according to the second embodiment hereof (selectively etching a copper foil)

The copper was selectively etched with the commercially available copper etching solution including sulfuric acid and peroxide (FIG. 6).

5. Removal of Etch-Stop Layer of Nickel

An etch-stop layer of nickel was removed using the commercially available nickel remover (N-950 available from Meltex Inc.) thereby to form a bump 10 (FIG. 7).

6. Fabricating Resist Wiring Pattern for Wiring Formation

The resist coat 4 was applied and then the light exposure and development processes were performed to form a resist wiring pattern for wiring formation 5 (FIG. 8).

7. The Copper was Etched Using a Commercially Available Alkaline Copper Etching Solution, Thereby to Form a Wiring. Subsequently, the Resist 4 was Removed (FIG. 9).

Industrial Applicability

The invention has an object to provide the wiring fabricating method which permits the wiring to be formed on the semiconductor in a highly precise and economical manner and which also permits the bump to be formed on the electrode in a highly precise and inexpensive manner.

Accordingly, the semiconductor device and wiring fabricating method of the invention are useful in the field of semiconductor fabrication.

What is claimed is:

1. A semiconductor device comprising a semiconductor, a metal foil for wiring formation, said metal foil comprising copper, aluminum, nickel, or an alloy of two or more of these metals, and a conductor wiring on the semiconductor.

2. A semiconductor device as claimed in claim 1, wherein said metal foil for wiring formation is a metal foil having a thickness of 1 to 50 μm.

3. A method for fabricating a conductor wiring circuit on a semiconductor comprising the steps of: overlaying a metal foil for wiring formation, said metal foil comprising copper, aluminum, nickel, or an alloy of two or more of these metals, on an electrode fabricating surface of a semiconductor; photo-etching the metal foil for fabricating a resist wiring pattern; etching the metal foil; and removing the resist to obtain a wiring.

4. A method for fabricating a conductor wiring circuit as claimed in claim 3, wherein said metal foil for wiring formation is a metal foil having a thickness of 1 to 50 μm.

5. A method for fabricating a conductor wiring circuit as claimed in any one of claim 3 or 6, wherein the semiconductor has a metallic thin film laid over a surface thereof.

6. A method for fabricating a conductor wiring circuit as claimed in claim 5, wherein said metallic thin film is formed of nickel.

7. A semiconductor device comprising: a semiconductor, a multilayer metal foil for wiring formation, said multilayer foil being a metal laminate comprising copper, aluminum, nickel, or an alloy of two or more these metals, a bump on the semiconductor and a conductor wiring.

8. A semiconductor device comprising: a semiconductor, a multilayer metal foil for wiring formation wherein said multilayer metal foil is a metal laminate comprising a copper or solder foil for bump formation, an etch-stop layer of nickel, and a wiring copper foil.

9. A semiconductor device as claimed in claim 8, wherein the etch-stop layer of nickel is laminated by plating.

10. A semiconductor device as claimed in claim 9, wherein the bump-fabricating copper or solder foil of the multilayer metal foil for wiring formation has a thickness of 5 to 100 μm, the etch-stop layer of plated nickel has a thickness of 0.5 to 3 μm, and the wiring copper foil has a thickness of 1 to 100 μm.

11. A semiconductor device as claimed in claim 8, wherein the etch-stop layer of nickel is formed by cladding a foil.

12. A semiconductor device as claimed in claim 11, wherein the bump-fabricating copper or solder foil of the multilayer metal foil for wiring formation has a thickness of 5 to 100 μm, the etch-stop layer of nickel clad has a thickness of 1 to 10 μm, and the wiring copper foil has a thickness of 1 to 100 μm.

13. A semiconductor device as claimed in claim 7, wherein the multilayer metal foil for wiring formation is a metal laminate comprising a copper or solder foil for bump formation, and a aluminum or silver foil for wiring formation.

14. A semiconductor device as claimed in claim 13, wherein the bump-fabricating copper or solder foil of the multilayer metal foil for wiring formation has a thickness of 5 to 100 μm, and the wiring-fabricating aluminum or silver foil has a thickness of 1 to 100 μm.

15. A method for fabricating a conductor wiring having a bump on a semiconductor comprising the steps of: overlaying a multilayer metal foil for wiring formation, said multilayer metal foil being a laminate comprising copper, aluminum, nickel, or an alloy of tow or more of these metals, on an electrode fabricating surface of a semiconductor; photo-etching the multilayer metal foil for fabricating a resist wiring pattern for bump formation; fabricating a bump by selective etching; removing an etch-stop layer; fabricating a resist wiring pattern for wiring formation; fabricating a wiring by etching; and removing the resist to obtain the wiring.

16. A method for fabricating a conductor wiring having a bump on a semiconductor as claimed in claim 15, wherein the multilayer metal foil for wiring formation is a metal laminate comprising a copper or solder foil for bump formation, an etch-stop layer of nickel, and a wiring copper foil.

17. A method for fabricating a conductor wiring having a bump on a semiconductor as claimed in claim 15, wherein the etch-stop layer of nickel is laminated by plating.

18. A method for fabricating a conductor wiring having a bump on a semiconductor as claimed in claim 17, wherein the bump-fabricating copper or solder foil of the multilayer metal foil for wiring formation has a thickness of 5 to 100 μm, the etch-stop layer of plated nickel having a thickness of 0.5 to 3 μm, the wiring copper foil having a thickness of 1 to 100 μm.

19. A method for fabricating a conductor wiring having a bump on a semiconductor as claimed in claim 15, wherein the etch-stop layer of nickel is formed by cladding a foil.

20. A method for fabricating a conductor wiring having a bump on a semiconductor as claimed in claim 19, wherein the bump-fabricating copper or solder foil of the multilayer metal foil for wiring formation has a thickness of 5 to 100 μm, the etch-stop layer of nickel clad has a thickness of 1 to 10 μm, and the wiring copper foil has a thickness of 1 to 100 μm.

21. A method for fabricating a conductor wiring having a bump on a semiconductor as claimed in claim 15, wherein the multilayer metal foil for wiring formation is a metal laminate comprising a copper or solder foil for bump formation, and an aluminum or silver foil for wiring formation.

22. A method for fabricating a conductor wiring having a bump on a semiconductor as claimed in claim 21, wherein the bump-fabricating copper or solder foil of the multilayer metal foil for wiring formation has a thickness of 5 to 100 μm, and the wiring-fabricating aluminum or silver foil has a thickness of 1 to 100 μm.

23. A method for fabricating a conductor wiring circuit as claimed in any one of claims 15, or 16 to 22, wherein the semiconductor has a metallic thin film laid over a surface thereof.

24. A method for fabricating a conductor wiring circuit as claimed in claim 23, wherein said metallic thin film is formed of nickel.

* * * * *